(12) United States Patent
Ning et al.

(10) Patent No.: US 6,750,115 B1
(45) Date of Patent: Jun. 15, 2004

(54) METHOD FOR GENERATING ALIGNMENT MARKS FOR MANUFACTURING MIM CAPACITORS

(75) Inventors: Xian J. Ning, Mohegan Lake, NY (US); Keith Kwong Hon Wong, Wappingers Falls, NY (US)

(73) Assignees: Infineon Technologies AG, Munich (DE); International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/303,462

(22) Filed: Nov. 25, 2002

(51) Int. Cl.$^7$ ............................................. H01I 21/8242
(52) U.S. Cl. ..................... 438/401; 438/238; 438/239; 438/250; 438/253; 438/381; 438/393; 438/396
(58) Field of Search ..................... 438/401, 238–242, 438/250–256, 381, 373–379

(56) References Cited

U.S. PATENT DOCUMENTS 6,218,262 B1 * 4/2001 Kuroi et al. ................ 438/401

FOREIGN PATENT DOCUMENTS

JP 2002-299588 * 11/2002 ......... H01L/27/108

OTHER PUBLICATIONS

Wong, K.K.H., et al. "Metallization By Plating For High–Performance Multipchip Modules," IBM J. Res. Develop. vol. 42 No. 5, Sep. 1998, pp 587–596.
Armacost, M., et al.: "A High Reliability Metal Insulator Metal Capacitor For 0.18μm Copper Technology," 2000 IEEE, 0–7803–6438–4/00, pp 7.4.1–7.4.4.

* cited by examiner

*Primary Examiner*—Thanh Nguyen
(74) *Attorney, Agent, or Firm*—Slater & Matsil, L.L.P.

(57) ABSTRACT

A method of manufacturing a semiconductor device, comprising depositing an insulating layer over a workpiece, and defining a pattern for at least one alignment marks, at least one MIM capacitor, and a plurality of conductive lines within the insulating layer. A resist is formed over the alignment marks and MIM capacitor pattern, and a conductive material is deposited over the wafer to fill the conductive pattern. The wafer is chemically-mechanically polished to remove excess conductive material from over the insulating layer and form conductive lines. The resist is removed from over the alignment mark and MIM capacitor pattern. MIM capacitor material layers are deposited over the wafer, and the wafer is chemically-mechanically polished to form a MIM capacitor, while leaving the topography of the alignment marks visible on the surface of the wafer, so that the alignment marks may be used for alignment of subsequently deposited layers of the semiconductor device.

52 Claims, 3 Drawing Sheets

METHOD FOR GENERATING ALIGNMENT MARKS FOR MANUFACTURING MIM CAPACITORS

CROSS-REFERENCE TO RELATED APPLICATIONS

This application relates to the following patent applications: Ser. No. 10/252,476, filed on Sep. 23, 2002, entitled "MIM Capacitor Structures and Fabrication Methods in Dual-Damascene Structures" and Ser. No. 10/161,867, filed on Jun. 3, 2002, entitled "Lithography Alignment and Overlay Measurement Marks Formed by Resist Mask Blocking for MRAMs", each of which is hereby incorporated herein by reference.

TECHNICAL FIELD

Embodiments of the present invention relate generally to the fabrication of semiconductor devices, and more particularly to the fabrication of metal-insulator-metal capacitors (MIM capacitors).

BACKGROUND

Semiconductors are used in integrated circuits for electronic applications, including radios, televisions, cell phones, and personal computing devices, as examples. Integrated circuits typically include multiple transistors fabricated in single crystal silicon. It is common for there to be millions of semiconductor devices on a single semiconductor product. Many integrated circuits now include multiple levels of metallization for interconnections.

Capacitors are elements that are used extensively in semiconductor devices for storing an electrical charge. Capacitors essentially comprise two conductive plates separated by an insulator. The capacitance, or amount of charge held by the capacitor per applied voltage, is measured in farads and depends upon a number of parameters such as the area of the plates, the distance between the plates, and the dielectric constant value for the insulator between the plates, as examples. Capacitors are used in filters, analog-to-digital converters, memory devices, control applications, and many other types of semiconductor devices.

One type of capacitor is a metal-insulator-metal capacitor (MIM capacitor), which is used often in mixed signal devices and logic devices, for example. MIM capacitors are used to store a charge in a variety of semiconductors. MIM capacitors typically require a much lower capacitance than deep trench memory capacitors, for example. A MIM capacitor may have a capacitance requirement of 1 fF/micrometer$^2$, for example. A MIM capacitor is typically formed horizontally on a semiconductor wafer, with two metal plates sandwiching a dielectric parallel to the wafer surface. At least one of the metal plates is usually formed in a metallization layer (metal interconnect layer) of the device. MIM capacitors embedded in the back-end-of-line (BEOL) structures have been used in many very large scale integrated logic (VLSI) devices in the past.

Horizontal MIM capacitors are manufactured in the BEOL, a stage in semiconductor device fabrication that usually begins with the formation of the first metallization layer on the wafer. MIM capacitors are typically formed in the BEOL by forming a bottom capacitive plate in a first or subsequently deposited horizontal metallization layer of a semiconductor wafer using a first lithography mask. A first etch step such as a reactive ion etch (RIE) is used to transfer the mask pattern to the bottom plate. A capacitor dielectric is deposited over the bottom capacitive plate, and a second mask and RIE step is used to pattern the capacitor dielectric. A top capacitive plate material is deposited over the capacitor dielectric, and a third mask and RIE step is used to form the top capacitive plate. Each mask and RIE step adds labor and cost to the MIM capacitor fabrication process.

Alignment techniques are implemented during manufacturing processes to ensure correct alignment of the various layers with one another within semiconductor devices such as MIM capacitors. Typically, alignment marks are utilized in the layers to assist in the alignment of features in different layers.

Because metal layers are not transparent to light, lithography of a MIM capacitor metal plate layer requires topographic features for alignment and overlay measurement marks. Typically this underlying MIM capacitor layer requires a chemical mechanical polish (CMP) process as a finish step.

Alignment marks are usually formed using additional lithography and reactive ion etch (RIE) steps to generate marks on the CMP-finished surface that exposes the copper and dielectric patterns. However, forming alignment marks in this manner requires an additional RIE process step and subsequent cleaning steps, thus increasing the processing costs and also increasing the chance of leaving particles on the CMP finished level. Also, an additional lithography mask is required to pattern the alignment marks, and the additional lithography mask must be aligned to an underlying layer, which reduces the overall overlay tolerance.

SUMMARY OF THE INVENTION

Embodiments of the present invention achieve technical advantages as a method of forming MIM capacitor structures in which previous level alignment and overlay marks are preserved during the formation of the MIM capacitors, without requiring an additional reactive-ion etch (RIE) process to form alignment marks for the MIM capacitor level and subsequent layers.

In accordance with a preferred embodiment of the present invention, a method of manufacturing a semiconductor device includes providing a semiconductor workpiece, forming an insulating layer over the workpiece, and defining a pattern for at least one alignment mark within the insulating layer, the alignment mark pattern comprising an alignment mark. The method includes defining a pattern for a plurality of conductive lines within the insulating layer, defining a pattern for at least one metal-insulator-metal (MIM) capacitor within the insulating layer, and forming a resist over the alignment mark and MIM capacitor pattern. A first conductive material is deposited over the insulating layer to fill the conductive line pattern and form conductive lines, leaving excess first conductive material disposed over the conductive lines. The resist is removed from over the alignment mark pattern and MIM capacitor pattern and the excess first conductive material is removed from over the conductive line pattern, wherein the alignment mark pattern may be used for alignment of subsequently formed layers of the semiconductor device.

In accordance with another preferred embodiment of the present invention, a method of manufacturing a semiconductor device, includes providing a semiconductor workpiece, forming an insulating layer over the workpiece, and defining a pattern for a plurality of conductive lines within the insulating layer, the conductive line pattern comprising a first depth. The method includes defining a pattern for at least one alignment mark within the insulating layer, the alignment mark pattern comprising an alignment mark, the alignment mark comprising a second depth, defining a pattern for at least one metal-insulator-metal (MIM) capacitor within the insulating layer, the MIM capacitor pattern having a third depth, and depositing a liner over the alignment mark and conductive line pattern. The method also includes forming a resist over the alignment mark and MIM capacitor pattern, depositing a first conductive material over the insulating layer to fill the conductive line pattern and form conductive lines, leaving excess first conductive material disposed over the insulating layer, and using a chemical-mechanical process to removing the resist from over the alignment mark pattern and MIM capacitor pattern and remove the excess first conductive material and liner from over the insulating layer. MIM capacitor material layers are deposited over the insulating layer, and a chemical-mechanical process is used to remove the MIM capacitor material layers from over the insulating layer and form a MIM capacitor within the MIM capacitor pattern, wherein a topography of the alignment mark pattern is visible from the top surface of the workpiece.

Advantages of embodiments of the invention include forming a semiconductor device including MIM capacitors, wherein the same alignment and overlay measurement marks in a CMP-finished level (such as the process flow for forming conductive lines, to be described further herein) are used as the alignment and overlay measurement marks that are used to align a subsequent layer. Because the original alignment marks are preserved during the MIM capacitor formation, an additional patterning, etch and cleaning step is avoided. Furthermore, alignment is more accurate, because there is no need to align new alignment marks with already existing alignment marks. Overlay budget is increased, because an additional overlay is not required.

Other advantages include a resist being used to block conductive material deposition within the alignment marks and MIM capacitor region, beneficial in that the resist may be left intact during the conductive material CMP process, preventing the CMP slurry from entering and becoming trapped within the alignment marks and MIM capacitor patterns, thus preserving the alignment mark and MIM capacitor pattern shape.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor device comprising a MIM capacitor. Embodiments of the invention may also be applied, however, to other semiconductor devices. Only one MIM capacitor structure is shown in each figure, although many MIM capacitor structures, conductive lines and alignment marks may be present within each layer. Similarly, only one MIM capacitor region, conductive region and alignment mark region is shown in each figure, although many MIM capacitor regions, conductive regions and alignment mark regions may be present within each layer. Dielectric and conductive material layers are generally numbered (e.g., first, second, third) in order of introduction in the description for convenience; the numbering does not indicate a preferred order of deposition, processing, or removal, for example.

Embodiments of the present invention include a method of transferring previous level alignment and overlay marks directly into a MIM capacitor and subsequent levels, without requiring an additional RIE process step to create new alignment marks.

Figure 1:
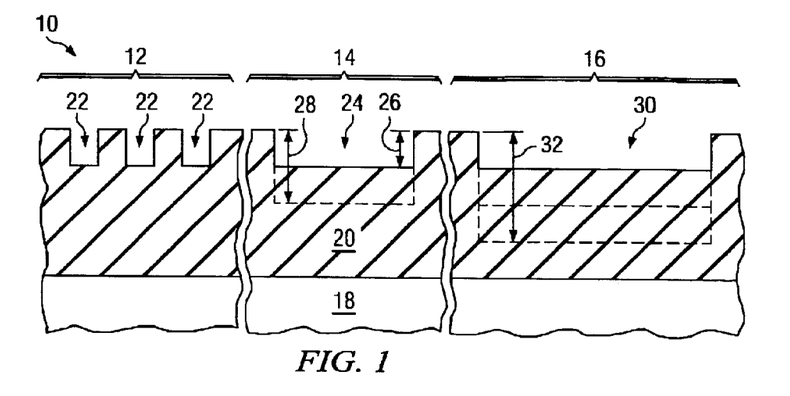
FIGS. 1 through 7 illustrate cross-sectional views of a MIM capacitor in various stages of manufacturing in accordance with a preferred embodiment of the present invention.

FIGS. 1–7 show cross-sectional views of a semiconductor device 10 including a MIM capacitor at various manufacturing stages, in accordance with a preferred embodiment of the present invention. Referring to FIG. 1, a workpiece 18 is provided. The workpiece 18 preferably comprises silicon oxide or a low-K dielectric over, and possibly abutting, single-crystal silicon. The workpiece 18 may include other conductive layers or other semiconductor elements, e.g. transistors, diodes, etc. Compound semiconductors such as GaAs, InP, Si/Ge, or SiC may alternatively be used in place of silicon, as examples. The workpiece includes at least one conductive line region 12, at least one alignment mark region 14, and at least one MIM capacitor region 16, as shown.

An insulating layer 20 is deposited over the workpiece 18. The insulating layer 20 preferably comprises an ILD layer comprising a high dielectric constant, such as silicon nitride, tantalum oxide or barium strontium titanate oxide (BSTO). Alternatively, the insulating layer 20 may comprise silicon oxynitride, silicon dioxide or a low-dielectric constant material, having a dielectric constant k of 3.6 or less, for example. If a low-k material is used, it may be spun-on and then exposed to a heating step (baked) of about 400 degrees C. to remove the solvents, for example. Alternatively, a low-k material may be deposited using a chemical vapor deposition (CVD) process.

The insulating layer 20 is patterned and etched to form areas or trenches that define a pattern 22 for a plurality of conductive lines in the conductive line region 12, a pattern 24 for at least one alignment mark 24 in the alignment mark region 14, and a pattern 30 for at least one MIM capacitor in the MIM capacitor region 16.

The depths of the patterned regions 12, 14, and 16 may be the same, or may be of different depths. In one embodiment, the conductive line pattern 22, alignment mark pattern 24 and MIM capacitor pattern 30 have the same depth 26 within the insulating layer 20. This is advantageous because one mask may be used to pattern the three regions 12, 14 and 16. Depth 26 may comprise a depth within the range of approximately 0.25 µm to 1 µm, as an example.

In another embodiment, the conductive line pattern 22 comprises depth 26 and the alignment mark pattern 24 and MIM capacitor pattern 30 have the same depth 28 (shown in phantom) within the insulating layer 20. In this embodiment, two masks are used to pattern the three regions 12, 14 and 16. A separate mask is required for each depth being patterned. Depth 28 is preferably larger than depth 26 and may comprise a depth within a range of approximately 0.5 µn to several aim, as an example.

In yet another embodiment, the conductive line pattern 22 comprises depth 26, the alignment mark pattern 24 comprises depth 28, and MIM capacitor pattern 30 comprises depth 32 (shown in phantom). In this embodiment, three masks are used to pattern the three regions 12, 14 and 16. Depth 32 is preferably larger than depth 28 and may comprise a depth within the range of 1 µm to several µm, as an example. In this embodiment, preferably the alignment mark pattern 24 is formed first, so this pattern 24 may be used for alignment while forming the conductive line pattern 22 and MIM capacitor pattern 30.

Preferably, a lithography and an etch process such as a RIE is used to define the conductive line pattern 22, alignment mark pattern 24 and MIM capacitor pattern 30. The process may be single damascene or dual damascene, for example. The conductive line pattern 22 may include vias (not shown), in a dual damascene process, for example. The depth of the MIM capacitor pattern 30 and/or alignment mark 24 may comprise the depth 26 of metal wiring plus the depth of vias, if present. The depth of the MIM capacitor pattern 30 and/or alignment mark 24 may comprise the entire depth of the insulating layer 20 (not shown).

The MIM capacitor pattern 30 comprises trenches that are typically approximately 0.2 to 1 micrometers deep, and may be in the shape of a circle, rectangle, or square, for example. The width of the trenches varies with the desired capacitance of the MIM capacitor and typically ranges from 2–3 square µm up to about 100 square µm. The larger the area of the MIM capacitor, the higher the capacitance.

The conductive line pattern 22 comprises a plurality of trenches. The trenches and insulating layer between the trenches preferably comprises a minimum feature size of the semiconductor device, for example, submicron in dimension. Alternatively, the conductive line pattern 22 may comprise trenches having a length and width in a range of 0.5 µm to several µm, as an example. The alignment marks 24 are preferably about 0.5 to 20 µm in width, for example.

Figure 2:
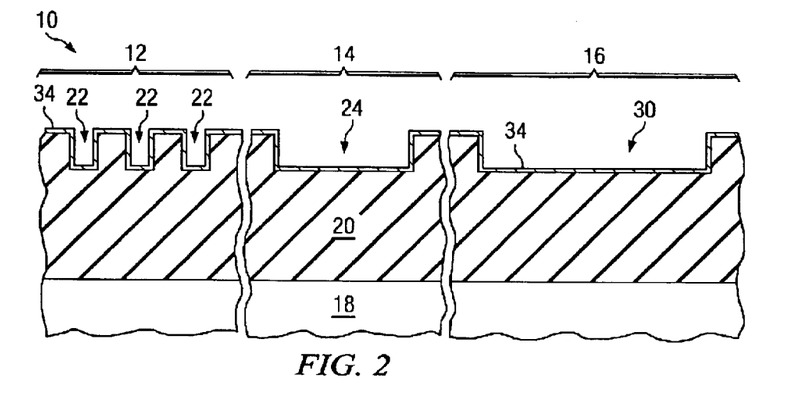

A liner 34 is formed over the surface of the insulating layer 20, as shown in FIG. 2. The liner 34 is preferably conductive, and preferably comprises a barrier layer deposited first over the insulating layer 20, followed by a seed layer deposited over the barrier layer. The barrier layer preferably comprises a material having a high conductivity that provides good adhesion to the underlying insulating layer 20. The barrier layer is preferably also adapted to act as a diffusion barrier, to prevent subsequently deposited materials such as copper from diffusing through the insulating layer 20. The barrier layer may comprise a copper barrier, for example. For example, if conductive lines 40 (see FIG. 5) comprise copper, preferably, the liner 34 comprises a copper barrier layer deposited over the insulating layer 20 surface within the trenches of the conductive line pattern 22, including along the trench sidewalls. The barrier layer may comprise TaN, TiN, WN, Ta, or combinations thereof, as examples. The barrier layer may alternatively comprise other materials. The barrier layer is preferably deposited in a thickness of about 5–100 nm.

The liner 34 preferably also comprises a seed layer comprising a copper seed layer, for example, formed over the barrier layer. The seed layer is adapted to improve the deposition of subsequently-deposited conductive material 38 (see FIG. 4), for example, in an electroplating process. The seed layer preferably comprises pure copper, a copper alloy comprising magnesium, indium, aluminum, or combinations thereof, as examples. Alternatively, the seed layer may comprise other conductive materials. The seed layer is preferably deposited in a thickness of about 50–200 nm, for example.

A photoresist 36 is deposited or formed over the insulating layer 20 over the entire surface of the device 10, which at this point in the manufacturing process includes the barrier layer 34 top surface. The photoresist 36 may comprise a positive or negative resist, and preferably comprises a photosensitive polymer that may be spun-on, for example. Alternatively, the photoresist 36 may comprise other resists, for example.

Figure 3:
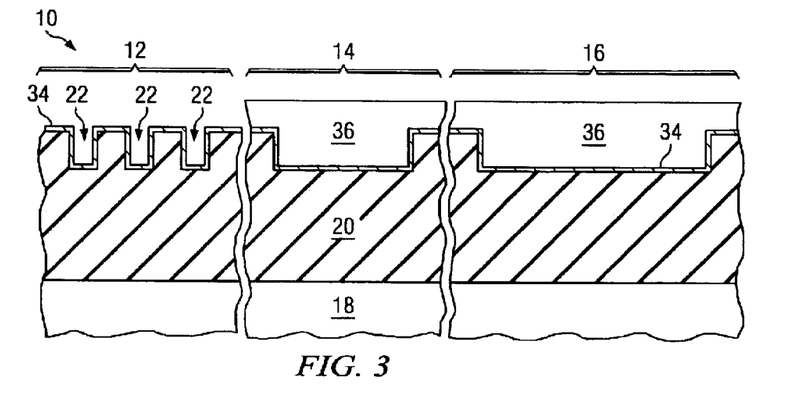

The photoresist 36 is patterned using lithographic techniques to leave the photoresist 36 over the MIM capacitor pattern 30 and alignment marks 24, remove the photoresist 36 from over the conductive line pattern 22, as shown in FIG. 3.

Figure 4:
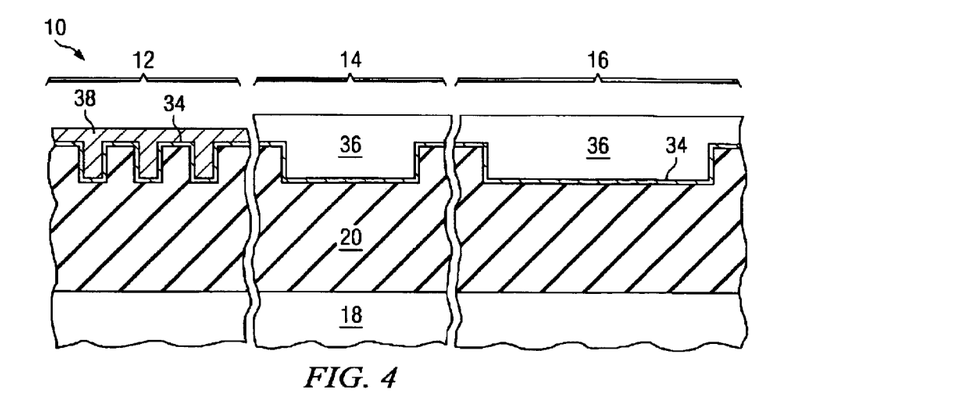

With the photoresist 36 covering and protecting the MIM capacitor pattern 30 and alignment marks 24 formed within the insulating layer 20, a conductive material 38 is deposited or formed over the insulating layer 20 in the conductive line pattern 22, as shown in FIG. 4. The conductive material 38 is also referred to herein as a first conductive layer. The conductive material 38 may comprise a copper alloy such as copper combined with magnesium, aluminum, indium or a combination thereof, for example. The use of copper is advantageous because of its superior conductivity and the ability to use smaller conductive lines because of the high conductivity of copper. When conductive material 38 comprises copper, preferably a plating process is used to deposit the copper conductive material 38 within the conductive line pattern 22 to ensure a void-free fill, for example. The liner 34 may be used to plate the conductive material 38 to form conductive lines 40, for example. Alternatively, the conductive material 38 may comprise other conductive materials such as Al, TiN, Ti, W, combinations thereof, or other conductive materials, deposited by physical vapor deposition (PVD) or chemical vapor deposition (CVD), as examples.

Figure 5:
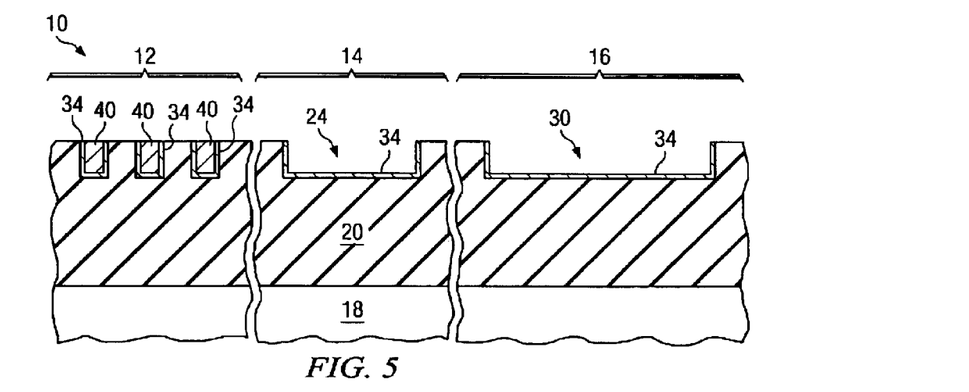

The resist 36 is cleaned from the top surface of the liner 34 in the alignment mark region 14 and the MIM capacitor region 16, as shown in FIG. 5, and a chemical-mechanical polish (CMP) process is used to remove the excess conductive material 38 and liner 34 from the top surface of the insulating material 20 and form conductive lines 40. Conductive lines 40 include conductive material 38 and the liner 34.

A damascene process described herein is preferably used to form conductive lines 40 comprising copper, because copper is difficult to etch. Conductive lines 40 may be part of an M1 or M2 metallization layer, as examples. The conductive lines 40 may comprise minimum pitched lines (e.g., having the smallest feature size) or alternatively, the conductive lines 40 may comprise larger pitched lines.

In one embodiment, the resist 36 strip and conductive material 38 CMP steps are reversed. With the resist 36 still residing over the alignment marks 24 and MIM capacitor pattern 30, the conductive material 38 is exposed to a chemical-mechanical polish (CMP) process to remove the excess conductive material 38, liner 34 and resist 36 from the top surface of the insulating material 20 to form conductive lines 40. The CMP may be designed such that the CMP process stops at the insulating material 20, for example. Then, the resist 36 may be removed from within the alignment mark 24 and from within the MIM capacitor pattern 30. This embodiment is advantageous in that the presence of resist 36 material inside the alignment mark 24 prevents CMP slurry from becoming trapped in the alignment mark 24 and MIM capacitor pattern 30, which can cause an irregular shape of the alignment mark 24 and MIM capacitor.

Figure 6:
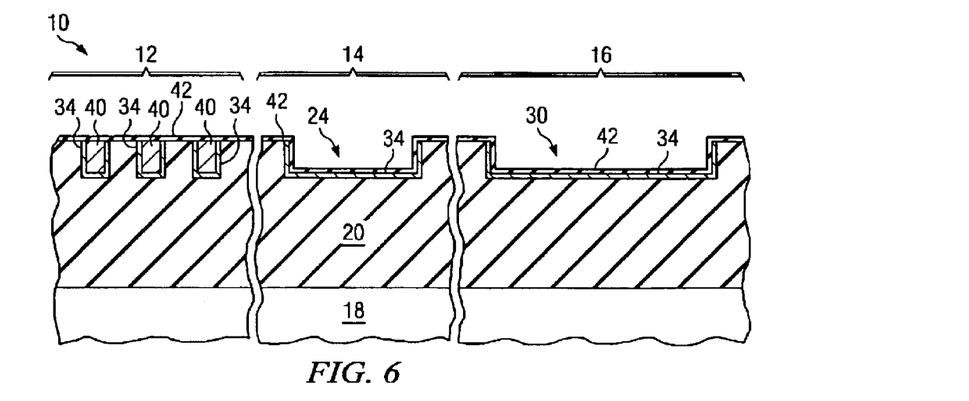

Next, MIM capacitor material layers 42 are deposited over the wafer to line all exposed surfaces, such as the conductive lines 40, the insulating layer 20 top surface, MIM capacitor pattern 30, and alignment mark 24, as shown in FIG. 6. The MIM capacitor material layers 42 preferably comprise a conductive layer 46, a dielectric layer 48 and a conductive layer 50 (not shown in FIG. 6; see FIG. 9.)

Figure 9:
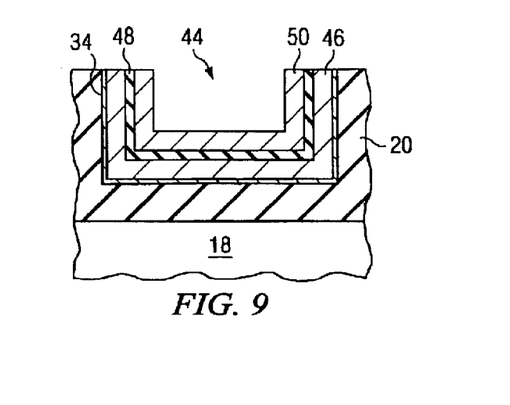
FIG. 9 shows a more detailed view of the MIM capacitor shown in FIG. 7.

Referring to FIG. 9, which illustrates a more detailed view of a MIM capacitor 44 in the MIM capacitor region 16 of the workpiece 18, first, conductive material 46 is deposited over the insulating layer 20 in the MIM capacitor pattern 30 and alignment mark 24, and also over the conductive lines 40 in the conductive line region 12. The conductive material 46 is also referred to herein as a second conductive layer, and forms the bottom plate of the MIM capacitor 44. The second conductive layer 46 preferably comprises a conductive material such as W, Ti, TiW, TiN, Ta, TaN, Al, Cu or other conducting materials, or combinations thereof, as examples. The second conductive layer 46 may be formed over the wafer using CVD, physical vapor deposition (PVD), evaporation, plating or a combination thereof, as examples. The second conductive layer 46 preferably comprises a thickness of approximately 500 Å to 4000 Å, for example.

A dielectric layer 48 is deposited over the second conductive layer 46. The dielectric layer 48 preferably comprises silicon oxide, silicon nitride, $Ta_2O_5$, aluminum oxide, strontium titanate, BSTO, a combination thereof, or other dielectric materials, as examples. The dielectric layer 48 may be deposited by CVD, PVD or a spin-on method, as examples. The dielectric layer 48 preferably comprises a thickness ranging from 200 Å to 2000 Å, as examples. Follow-up processes such as cure, plasma treatment, and anneal of the dielectric layer 48 are made if needed.

A conductive layer 50 is deposited over the dielectric layer 48. The conductive layer 50 is also referred to herein as a third conductive layer, and forms a top plate of the MIM capacitor 44. The third conductive layer 50 may comprise a conductive material such as W, Ti, TiW, TiN, Ta, TaN, Al, Cu, other metals, or/and a combination thereof, as examples. The third conductive layer 50 may be deposited by CVD, PVD, evaporation, plating or a combination thereof, as examples. The thickness of the third conductive layer 50 preferably ranges from 200 Å to 4000 Å, as examples.

Figure 7:
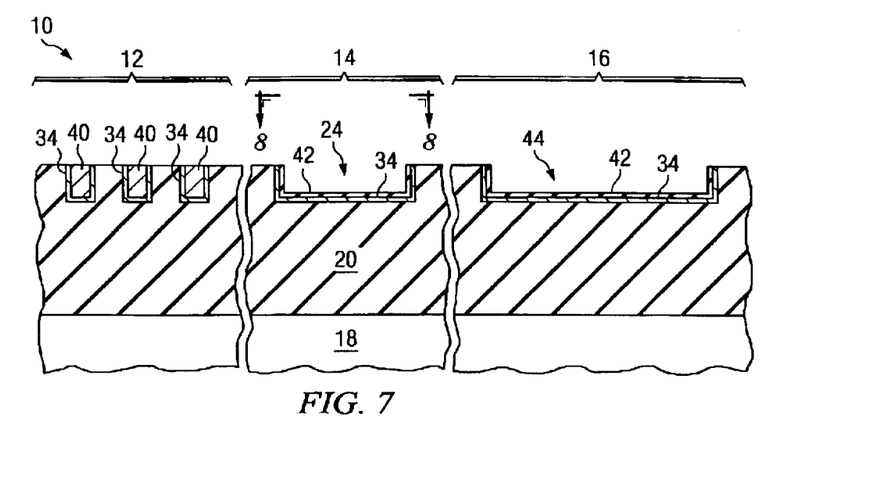

A planarization process such as a chemical-mechanical polish (CMP) process is performed on the surface of the wafer to remove the excess material layers 38, 46, 48 and 50 from over the insulating layer 20 top surface, as shown in FIG. 7. The CMP process is preferably adapted to stop on the ILD insulating layer 20. The planarization process results in the formation of a horizontal (e.g. along the length of the wafer) MIM capacitor 44 having a top plate (third conductive layer 50), capacitor dielectric (dielectric layer 48) and a bottom plate (second conductive layer 46). During the planarization process, MIM capacitor 44 is formed in the MIM capacitor region 16 while preserving the topography of the alignment mark 24, by the removal of the MIM capacitor material layer 42 from the surface of the insulating layer 20.

Subsequent processing steps are then performed on the semiconductor device 10. Vias from underlying and overlying subsequently deposited layers may be coupled to the top and bottom MIM capacitor plates 50/46 to electrically connect to the plates (not shown). Dielectric layers may be deposited over the top surface of the MIM capacitor 44 (also not shown). Other devices, components and metallization layers may be formed in subsequently deposited dielectric layers, for example.

Figure 8:
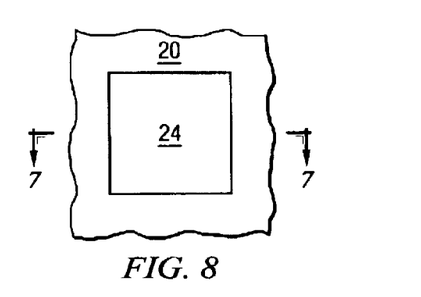
FIG. 8 shows a top view of the alignment mark shown in FIG. 7.

The topography of the alignment marks 24 is transferred to the surface of the MIM capacitor 44 and is visible from the top surface of the wafer, as shown in FIG. 8. The alignment marks 24 remain visible on the wafer because they are recessed below the wafer surface. Therefore, the alignment and overlay measurement marks 24 may be used to align subsequent layers.

Embodiments of the present invention achieve technical advantages as a process for forming an MIM capacitor 44 wherein the same alignment and overlay measurement marks 24 in a CMP-finished level (such as the process flow for forming MIM capacitor 44 described herein) are used as the alignment and overlay measurement marks 24 that are used to align a subsequently-deposited layers. Resist 36 is used to block the conductive material 38 deposition within the alignment marks 24 and MIM capacitor pattern 30. The resist 36 is also beneficial in that it may be left intact during the conductive material 38 CMP process, preventing the CMP slurry from entering and becoming trapped within the alignment marks 24 and MIM capacitor pattern 30, and thus preserving the alignment mark 24 and MIM capacitor pattern 30 shape. Because the original alignment and overlay measurement marks 24 are preserved, an additional patterning, etch and cleaning step is avoided. Furthermore, alignment is more accurate, because there is no need to align new alignment marks with already existing alignment marks. Overlay budget is increased, because an additional overlay is not required.

Embodiments of the invention are described with reference to a particular application for an MIM capacitor herein; however, embodiments of the invention also have application in other semiconductor devices.

Although the present invention and its advantages have been described in detail, it should be understood that various changes, substitutions and alterations can be made herein without departing from the spirit and scope of the invention as defined by the appended claims.

For example, it will be readily understood by those skilled in the art that the order of the processing steps, materials, types of processes used, and dimensions may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a semiconductor device, comprising:

providing a semiconductor workpiece;

forming an insulating layer over the workpiece;

defining a pattern for at least one alignment mark within the insulating layer, the alignment mark pattern comprising an alignment mark;

defining a pattern for a plurality of conductive lines within the insulating layer;

defining a pattern for at least one metal-insulator-metal (MM) capacitor within the insulating layer;

forming a resist over the alignment mark and MIM capacitor pattern;

depositing a first conductive material over the insulating layer to fill the conductive line pattern and form conductive lines, leaving excess first conductive material disposed over the conductive lines; and removing the resist from over the alignment mark pattern and MIM capacitor pattern and removing the excess first conductive material from over the conductive line pattern, wherein the alignment mark pattern is suitable for aligning subsequently formed layers of the semiconductor device.

2. The method according to claim 1, wherein removing the resist and excess first conductive material comprises:

first, removing the resist from over the alignment marks and MIM capacitor pattern; and second, using a chemical-mechanical polish process to remove the excess first conductive material from over the conductive lines.

3. The method according to claim 1, wherein removing the resist and excess first conductive material comprises:

first, using a chemical-mechanical polish process to remove the excess first conductive material from over the first conductive lines; and second, removing the resist from over the alignment marks and MIM capacitor pattern.

4. The method according to claim 1, further comprising:

depositing a liner over the alignment mark and conductive line pattern, prior to forming a resist over the alignment mark and MIM capacitor pattern; and removing the liner from a top surface of the insulating layer while removing the excess first conductive material from over the conductive lines.

5. The method according to claim 4, wherein depositing a liner comprises:

depositing a barrier layer; and depositing a seed layer over the barrier layer.

6. The method according to claim 5, wherein depositing a barrier layer comprises depositing 5–100 nm of TaN, TiN, WN, Ta, or combinations thereof; and wherein depositing a seed layer comprises depositing 50–200 nm of pure copper, a copper alloy comprising magnesium, indium, aluminum, or combinations thereof.

7. The method according to claim 1, wherein depositing a first conductive material comprises depositing a material including copper.

8. The method according to claim 1, wherein depositing a first conductive material comprises plating the first conductive material.

9. The method according to claim 1, wherein depositing the first conductive material comprises a single or dual Damascene process.

10. The method according to claim 1, wherein forming the resist comprises depositing a resist over the wafer, and removing a portion of the resist.

11. The method according to claim 1, wherein the alignment marks comprise overlay measurement marks.

12. The method according to claim 1, further comprising:

depositing a second conductive material over at least the insulating layer top surface;

depositing a dielectric material over the second conductive material;

depositing a third conductive material over the dielectric material; and chemical-mechanically polishing the workpiece to remove the excess second conductive material, dielectric material and third conductive material from the top surface of the insulating layer, wherein the second conductive material remaining within the MIM capacitor pattern forms a bottom capacitor plate, the dielectric material remaining within the MIM capacitor pattern forms a capacitor dielectric, and the third conductive material remaining within the MIM capacitor pattern comprises a top capacitor plate.

13. The method according to claim 1, wherein a topography of the alignment mark is visible on a top surface of the insulating layer.

14. The method according to claim 1, wherein the pattern for the plurality of conductive lines comprises a first depth, wherein the pattern for the at least one alignment mark comprises the first depth.

15. The method according to claim 14, wherein the pattern for the at least one metal-insulator-metal (MIM) capacitor comprises the first depth.

16. The method according to claim 14, wherein the pattern for the at least one metal-insulator-metal (MIM) capacitor comprises a second depth, the second depth being greater than the first depth.

17. The method according to claim 1, wherein the pattern for the plurality of conductive lines comprises a first depth, and wherein the pattern for the at least one alignment mark comprises a second depth, the second depth being greater than the first depth.

18. The method according to claim 17, wherein the pattern for the at least one metal-insulator-metal (MIM) capacitor comprises a third depth, the third depth being greater than the second depth.

19. A method of manufacturing a semiconductor device, comprising:

providing a semiconductor workpiece;

forming an insulating layer over the workpiece;

defining a pattern for a plurality of conductive lines within the insulating layer, the conductive line pattern comprising a first depth;

defining a pattern for at least one alignment mark within the insulating layer, the alignment mark pattern comprising an alignment mark, the alignment mark comprising a second depth;

defining a pattern for at least one metal-insulator-metal (MIM) capacitor within the insulating layer, the MIM capacitor pattern having a third depth;

depositing a liner over the alignment mark and conductive line pattern;

forming a resist over the alignment mark and MIM capacitor pattern;

depositing a first conductive material over the insulating layer to fill the conductive line pattern and form conductive lines, leaving excess first conductive material disposed over the insulating layer;

using a chemical-mechanical process to removing the resist from over the alignment mark pattern and MIM capacitor pattern and remove the excess first conductive material and liner from over the insulating layer, depositing MIM capacitor material layers over the insulating layer; and using a chemical-mechanical process to remove the MIM capacitor material layers from over the insulating layer and form a MIM capacitor within the MIM capacitor pattern, wherein a topography of the alignment mark pattern is visible from the top surface of the workpiece.

20. The method according to claim 19, wherein removing the resist and excess first conductive material comprises:

first, removing the resist from over the alignment marks and MIM capacitor pattern; and second, using a chemical-mechanical polish process to remove the excess first conductive material from over the conductive lines.

21. The method according to claim 19, wherein removing the resist and excess first conductive material comprises:

first, using a chemical-mechanical polish process to remove the excess first conductive material from over the first conductive lines; and second, removing the resist from over the alignment marks and MIM capacitor pattern.

22. The method according to claim 19, wherein depositing a liner comprises:

depositing a barrier layer; and depositing a seed layer over the barrier layer.

23. The method according to claim 22, wherein depositing a barrier layer comprises depositing 5–100 nm of TaN, TiN, WN, Ta, or combinations thereof; and wherein depositing a seed layer comprises depositing 50–200 nm of pure copper, a copper alloy comprising magnesium, indium, aluminum, or combinations thereof.

24. The method according to claim 19, wherein depositing a first conductive material comprises depositing a material including copper, and wherein depositing a first conductive material comprises plating the first conductive material.

25. The method according to claim 19, wherein the first depth, second depth and third depths are the same.

26. The method according to claim 19, wherein the second depth is greater than the first depth.

27. The method according to claim 26, wherein the third depth is greater than the second depth.

28. A method of manufacturing a semiconductor device, comprising:

providing a semiconductor workpiece;

forming an insulating layer over the workpiece;

defining a pattern for at least one alignment mark within the insulating layer, the alignment mark pattern comprising an alignment mark;

defining a pattern for a plurality of conductive lines within the insulating layer;

defining a pattern for at least one metal-insulator-metal (MIM) capacitor within the insulating layer;

forming a resist over the alignment mark and MIM capacitor pattern;

depositing a first conductive material over the insulating layer to fill the conductive line pattern and form conductive lines, leaving excess first conductive material disposed over the conductive lines;

removing the excess first conductive material from over the conductive line pattern by a chemical-mechanical polish process; and removing the resist from over the alignment mark pattern and MIM capacitor pattern, wherein the alignment mark pattern is suitable for aligning subsequently formed layers of the semiconductor device.

29. The method according to claim 28, further comprising:

depositing a liner over the alignment mark and conductive line pattern, prior to forming a resist over the alignment mark and MIM capacitor pattern; and removing the liner from a top surface of the insulating layer while removing the excess first conductive material from over the conductive lines.

30. The method according to claim 29, wherein depositing a liner comprises:

depositing a barrier layer; and depositing a seed layer over the barrier layer.

31. The method according to claim 30, wherein depositing a barrier layer comprises depositing 5–100 nm of TaN, TiN, WN, Ta, or combinations thereof; and wherein depositing a seed layer comprises depositing 50–200 nm of pure copper, a copper alloy comprising magnesium, indium, aluminum, or combinations thereof.

32. The method according to claim 28, wherein depositing a first conductive material comprises depositing a material including copper.

33. The method according to claim 28, wherein depositing a first conductive material comprises plating the first conductive material.

34. The method according to claim 28, wherein depositing the first conductive material comprises a single or dual Damascene process.

35. The method according to claim 28, wherein forming the resist comprises depositing a resist over the wafer, and removing a portion of the resist.

36. The method according to claim 28, wherein the alignment marks comprise overlay measurement marks.

37. The method according to claim 28, further comprising:

depositing a second conductive material over at least the insulating layer top surface;

depositing a dielectric material over the second conductive material;

depositing a third conductive material over the dielectric material; and chemical-mechanically polishing the workpiece to remove the excess second conductive material, dielectric material and third conductive material from the top surface of the insulating layer, wherein the second conductive material remaining within the MIM capacitor pattern forms a bottom capacitor plate, the dielectric material remaining within the MIM capacitor pattern forms a capacitor dielectric, and the third conductive material remaining within the MIM capacitor pattern comprises a top capacitor plate.

38. The method according to claim 28, wherein a topography of the alignment mark is visible on a top surface of the insulating layer.

39. The method according to claim 28, wherein the pattern for the plurality of conductive lines comprises a first depth, wherein the pattern for the at least one alignment mark comprises the first depth.

40. The method according to claim 39, wherein the pattern for the at least one metal-insulator-metal (MIM) capacitor comprises the first depth.

41. The method according to claim 39, wherein the pattern for the at least one metal-insulator-metal (MIM) capacitor comprises a second depth, the second depth being greater than the first depth.

42. The method according to claim 28, wherein the pattern for the plurality of conductive lines comprises a first depth, and wherein the pattern for the at least one alignment mark comprises a second depth, the second depth being greater than the first depth.

43. The method according to claim 42, wherein the pattern for the at least one metal-insulator-metal (MIM) capacitor comprises a third depth, the third depth being greater than the second depth.

44. A method of manufacturing a semiconductor device, comprising:

providing a semiconductor workpiece;

forming an insulating layer over the workpiece;

defining a pattern for at least one alignment mark within the insulating layer, the alignment mark pattern comprising an alignment mark;

defining a pattern for a plurality of conductive lines within the insulating layer;

defining a pattern for at least one metal-insulator-metal (MIM) capacitor within the insulating layer;

depositing a liner over the alignment mark and conductive line patterns defined in the insulating layer;

forming a resist over the alignment mark and MIM capacitor pattern;

depositing a first conductive material over the insulating layer to fill the conductive line pattern and form conductive lines, leaving excess first conductive material disposed over the conductive lines; and removing the resist from over the alignment mark pattern and MIM capacitor pattern and removing the excess first conductive material from over the conductive line pattern and the liner, wherein the alignment mark pattern is suitable for aligning subsequently formed layers of the semiconductor device.

45. A method of manufacturing a semiconductor device, comprising:

providing a semiconductor workpiece;

forming an insulating layer over the workpiece;

defining a pattern for at least one alignment mark within the insulating layer, the alignment mark pattern comprising an alignment mark;

defining a pattern for a plurality of conductive lines within the insulating layer;

defining a pattern for at least one metal-insulator-metal (MIM) capacitor within the insulating layer;

forming a resist over the alignment mark and MIM capacitor pattern;

depositing a first conductive material over the insulating layer to fill the conductive line pattern and form conductive lines, leaving excess first conductive material disposed over the conductive lines;

removing the resist from over the alignment mark pattern and MIM capacitor pattern and removing the excess first conductive material from over the conductive line pattern, wherein the alignment mark pattern is suitable for aligning subsequently formed layers of the semiconductor device;

depositing a second conductive material over at least the insulating layer top surface;

depositing a dielectric material over the second conductive material;

depositing a third conductive material over the dielectric material; and chemical-mechanically polishing the workpiece to remove the excess second conductive material, dielectric material and third conductive material from the top surface of the insulating layer, wherein the second conductive material remaining within the MIM capacitor pattern forms a bottom capacitor plate, the dielectric material remaining within the MIM capacitor pattern forms a capacitor dielectric, and the third conductive material remaining within the MIM capacitor pattern comprises a top capacitor plate.

46. A method of manufacturing a semiconductor device, comprising:

providing a semiconductor workpiece;

forming an insulating layer over the workpiece;

defining a pattern for a plurality of conductive lines within the insulating layer, the conductive line pattern comprising a first depth;

defining a pattern for at least one alignment mark within the insulating layer, the alignment mark pattern comprising an alignment mark, the alignment mark comprising a second depth;

defining a pattern for at least one metal-insulator-metal (MIM) capacitor within the insulating layer, the MIM capacitor pattern having a third depth;

depositing a liner over the alignment mark and conductive line pattern;

forming a resist over the alignment mark and MIM capacitor pattern;

depositing a first conductive material over the insulating layer to fill the conductive line pattern and form conductive lines, leaving excess first conductive material disposed over the insulating layer;

removing the excess first conductive material and liner from over the insulating layer;

removing the resist from over the alignment mark pattern and MIM capacitor pattern by a chemical-mechanical polish process;

depositing MIM capacitor material layers over the insulating layer; and using a chemical-mechanical process to remove the MIM capacitor material layers from over the insulating layer and form a MIM capacitor within the MIM capacitor pattern, wherein a topography of the alignment mark pattern is visible from the top surface of the workpiece.

47. The method according to claim 46, wherein depositing a liner comprises:

depositing a barrier layer; and depositing a seed layer over the barrier layer.

48. The method according to claim 47, wherein depositing a barrier layer comprises depositing 5–100 nm of TaN, TiN, WN, Ta, or combinations thereof; and wherein depositing a seed layer comprises depositing 50–200 nm of pure copper, a copper alloy comprising magnesium, indium, aluminum, or combinations thereof.

49. The method according to claim 46, wherein depositing a first conductive material comprises depositing a material including copper, and wherein depositing a first conductive material comprises plating the first conductive material.

50. The method according to claim 46, wherein the first depth, second depth and third depths are the same.

51. The method according to claim 46, wherein the second depth is greater than the first depth.

52. The method according to claim 51, wherein the third depth is greater than the second depth.

* * * * *

UNITED STATES PATENT AND TRADEMARK OFFICE
CERTIFICATE OF CORRECTION

PATENT NO.    : 6,750,115 B1
DATED         : June 15, 2004
INVENTOR(S)   : Ning et al.

It is certified that error appears in the above-identified patent and that said Letters Patent is hereby corrected as shown below:

Column 9,
Line 19, delete "(MM)" and insert -- (MIM) --.

Signed and Sealed this

Twenty-third Day of November, 2004

JON W. DUDAS
*Director of the United States Patent and Trademark Office*